United States Patent

Sun et al.

(10) Patent No.: US 7,532,468 B2
(45) Date of Patent: May 12, 2009

(54) HEAT SINK HAVING HIGH HEAT DISSIPATION EFFICIENCY

(75) Inventors: Ke Sun, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/778,074

(22) Filed: Jul. 16, 2007

(65) Prior Publication Data

US 2008/0074845 A1 Mar. 27, 2008

(30) Foreign Application Priority Data

Sep. 27, 2006 (CN) ............... 2006 1 0200928

(51) Int. Cl.
*H05K 7/20* (2006.01)

(52) U.S. Cl. ............... 361/690; 361/697; 361/704; 165/80.3; 165/185

(58) Field of Classification Search ........... 361/690, 361/700, 704, 695, 697, 712; 165/80.3, 121, 165/104.33, 185; 257/715; 174/16.3, 16.1; 62/259.2

See application file for complete search history.

(56) References Cited

U.S. PATENT DOCUMENTS

| 4,103,737 | A | * | 8/1978 | Perkins ............... 165/109.1 |
| 4,765,397 | A | * | 8/1988 | Chrysler et al. ........ 165/104.33 |
| 4,953,634 | A | * | 9/1990 | Nelson et al. ............. 165/147 |
| 5,040,596 | A | * | 8/1991 | Terasaki et al. ........... 165/166 |
| 5,077,601 | A | * | 12/1991 | Hatada et al. ............. 257/722 |
| 5,542,176 | A | * | 8/1996 | Serizawa et al. ......... 29/890.03 |
| 5,709,263 | A | * | 1/1998 | Mira ..................... 165/80.3 |
| 5,860,472 | A | * | 1/1999 | Batchelder ............... 165/185 |
| 6,104,609 | A | * | 8/2000 | Chen ...................... 361/695 |
| 6,154,368 | A | * | 11/2000 | Scofield ................... 361/719 |
| 6,209,623 | B1 | | 4/2001 | Tantoush |
| 6,364,009 | B1 | * | 4/2002 | MacManus et al. ........ 165/185 |
| 6,401,807 | B1 | * | 6/2002 | Wyler et al. .............. 165/121 |
| 6,434,004 | B1 | | 8/2002 | Matteson |
| 6,501,651 | B2 | * | 12/2002 | Lin et al. ................. 361/697 |
| 6,925,829 | B2 | * | 8/2005 | Wei ....................... 62/259.2 |
| 6,935,419 | B2 | * | 8/2005 | Malone et al. ............. 165/185 |
| 7,038,911 | B2 | * | 5/2006 | Foster et al. .............. 361/695 |
| 7,156,158 | B2 | * | 1/2007 | Ueda et al. .............. 165/104.21 |

(Continued)

*Primary Examiner*—Jayprakash N Gandhi
*Assistant Examiner*—Courtney L Smith
(74) *Attorney, Agent, or Firm*—Frank R. Niranjan

(57) ABSTRACT

A heat sink includes a thermally conductive base, a plurality of thermally conductive fins extending from the base, and a guiding member. The base has a top surface from which the fins extend, and a bottom surface for being attached onto a heat-generating electronic component. A channel is formed between every two fins. Each of the fins is generally rectangular with the top edge being shorter than the bottom edge. Each of the fins comprises an upright side edge perpendicular to the top surface of the base, and an opposite streamlined side edge. The upright side edges and the streamlined side edges cooperate with the channels to form an air inlet for airflow flowing into the channels and an air outlet for airflow flowing out of the channels, respectively. The guiding member is attached at the streamlined side edges of the fins for guiding airflow flowing out of the channels.

10 Claims, 6 Drawing Sheets

U.S. PATENT DOCUMENTS

| | | | |
|---|---|---|---|
| 7,290,598 B2 * | 11/2007 | Hanin et al. | 165/185 |
| 2002/0056544 A1 * | 5/2002 | Azar | 165/80.3 |
| 2002/0167798 A1 * | 11/2002 | Jui-Yuan | 361/697 |
| 2002/0174980 A1 * | 11/2002 | DiBene et al. | 165/185 |
| 2003/0155106 A1 * | 8/2003 | Malone et al. | 165/121 |
| 2003/0202327 A1 * | 10/2003 | Chung et al. | 361/697 |
| 2003/0210525 A1 * | 11/2003 | Chung et al. | 361/695 |
| 2005/0161201 A1 * | 7/2005 | Shiang-Chich | 165/121 |
| 2005/0230081 A1 * | 10/2005 | Lin | 165/80.3 |
| 2006/0028798 A1 * | 2/2006 | Wang | 361/697 |
| 2006/0067050 A1 * | 3/2006 | Li et al. | 361/697 |
| 2007/0261822 A1 * | 11/2007 | Lin et al. | 165/104.33 |
| 2008/0011452 A1 * | 1/2008 | Lai et al. | 165/80.3 |
| 2008/0017365 A1 * | 1/2008 | Lai et al. | 165/185 |

* cited by examiner

HEAT SINK HAVING HIGH HEAT DISSIPATION EFFICIENCY

BACKGROUND OF THE INVENTION

1. Field of the Invention

The present invention relates to heat sinks, and more particularly to a heat sink having high heat dissipation efficiency.

2. Description of Related Art

With the development of the large scale integration semiconductor industry, the density of integration of an integrated circuit chip (the core component of many electronic systems) is becoming greater and greater, so the chip can run at unprecedented high speeds and generates large amounts of heat. The heat must be quickly and efficiently removed from the chip to keep the chip operable.

Generally, a heat sink abuts onto the chip to absorb and conduct the heat generated by the chip. Referring to FIGS. 5 and 6, a conventional heat sink 50 includes a rectangular base 52, and a plurality of parallel fins 54 extending up from the base 52 with channels 56 being formed between every two adjacent fins 54. In use, the heat sink 50 is attached onto a chip (not shown) via a bottom surface of the base 52 clinging to a top surface of the chip. A fan (not shown) is set, to assist in heat dissipation, at a certain distance from the heat sink 50. Airflow 58 from the fan enters into the channels 56 of the heat sink 50 through an air inlet 57 of the heat sink 10, and exits from an air outlet 59 of the heat sink 10. Thus, the heat generated by the chip is dissipated so that the chip can run within the normal work temperature range.

However, because of resistance of the fins 54 to the airflow 58, when the heated airflow 58 comes close to the air outlet 59 of the heat sink 50, the speed of the airflow 58 slows and the heated airflow 58 can not quickly exit from the heat sink 50, which impairs heat dissipation efficiency of the heat sink 50. In addition, partial airflow 582 of the heated airflow 58 flowing out of the air outlet 59 is guided by another system fan (not shown) to escape out of an electronic system, but main airflow 584 of the heated airflow 58 freely dissipates in the system, thereby impairing heat dissipation of the system.

What is desired, therefore, is a heat sink which has high heat dissipation efficiency and facilitates heat dissipation of an electronic system in which the heat sink is positioned.

SUMMARY OF THE INVENTION

In one preferred embodiment, a heat sink includes a thermally conductive base, a plurality of parallel thermally conductive fins extending from the base, and a guiding member. The base has a top surface from which the fins extend, and a bottom surface for being attached onto a heat-generating electronic component. A channel is formed between every two adjacent fins. Each of the fins is generally rectangular with the top edge being shorter than the bottom edge. Each of the fins comprises an upright side edge perpendicular to the top surface of the base, and an opposite streamlined side edge. The upright side edges of the fins cooperate with the channels to form an air inlet for airflow flowing into the channels. The streamlined side edges of the fins cooperate with the channels to form an air outlet for airflow flowing out of the channels. The guiding member is attached at the streamlined side edges of the fins for guiding airflow flowing out of the channels.

Other advantages and novel features of the present invention will become more apparent from the following detailed description of preferred embodiment when taken in conjunction with the accompanying drawings, in which:

DETAILED DESCRIPTION OF THE INVENTION

Figure 1:
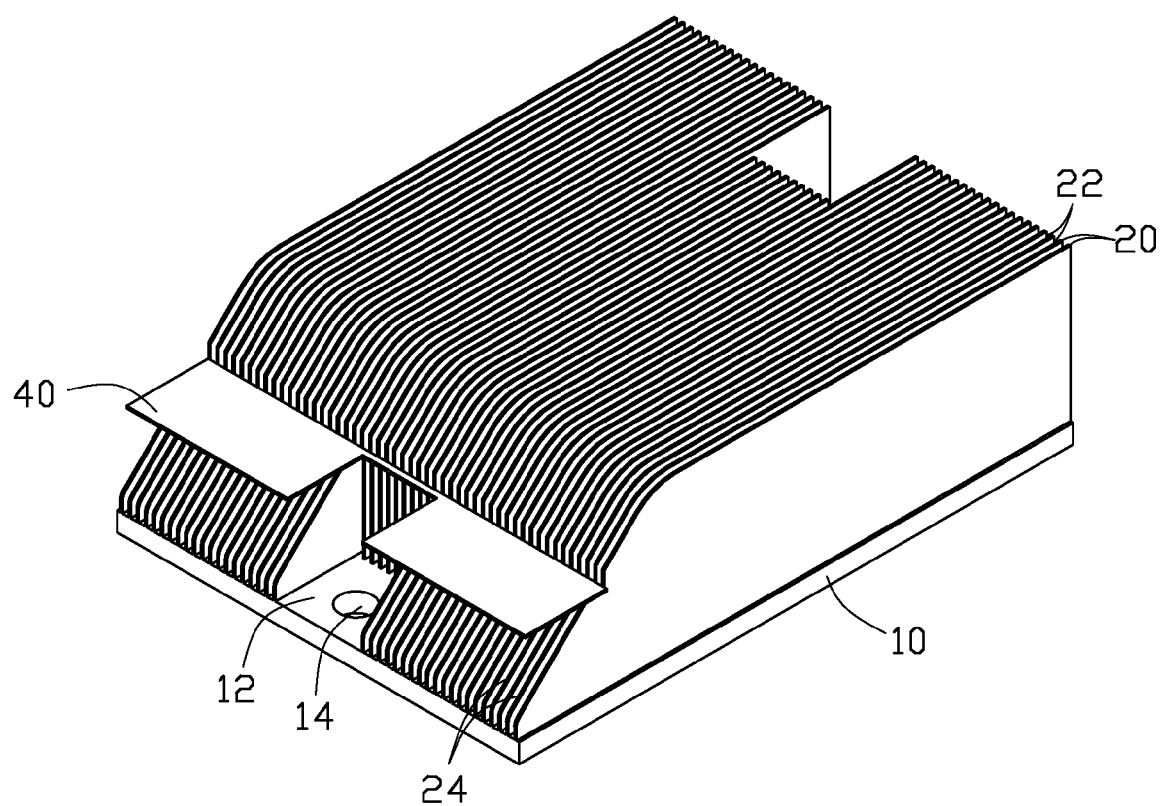
FIG. 1 is an isometric view of a heat sink in accordance with a first embodiment of the present invention.
Figure 2:
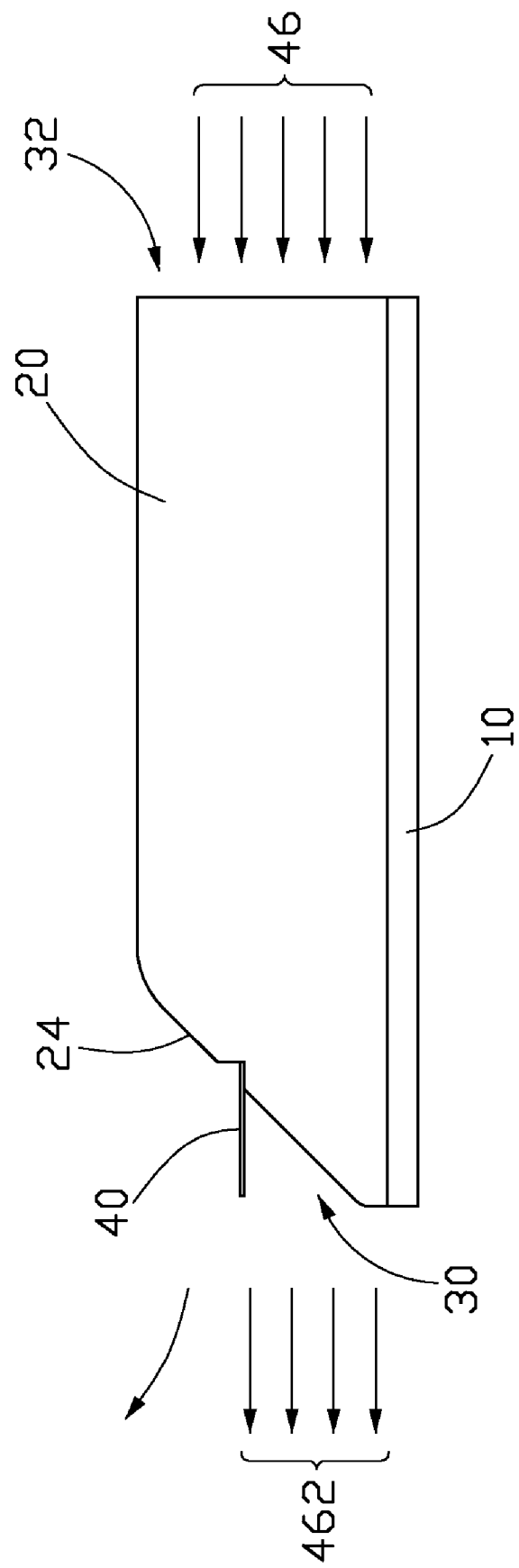
FIG. 2 is a side-elevation view of FIG. 1.

Referring to FIGS. 1 and 2, in a first embodiment of the present invention, a heat sink includes a thermally conductive base 10 having a top surface 12 and a bottom surface (not visible) generally for being attached onto a heat-generating electronic component such as a Central Processing Unit (CPU), a plurality of spaced thermally conductive individual fins 20 extending substantially perpendicularly from the top surface 12, and a guiding member being disposed at one side of the fins 20.

The base 10 is a rectangular board with a certain thickness made of high thermal conductivity material such as copper in the first embodiment. Two installing holes 14 are defined in the base 10. The fins 20 are made of high thermal conductivity material such as aluminum in the first embodiment and welded in parallel onto the top surface 12 of the base 10. A channel 22 is formed between every two adjacent fins 20. Each fin 20 is generally rectangular, with the top edge being shorter than the bottom edge, and an upright side edge perpendicular to the top and bottom edges, together with the channels 22 forming an air inlet 32, and an opposite diagonally sloping side edge 24 together with the channels 22 forming an air outlet 30. The fins 20 substantially decreases from adjacent the air outlet 30 to the distal end of air outlet 300 along longitudinal directions of the fins 20, thereby forming the diagonally loping side edges 24. A cutout is defined at middle portions of the diagonally sloping side edge 24 of each of the fins 20, Bottom edges of the cutouts cooperatively form a surface parallal to the top surface 12 of the base 10. In the first embodiment, the diagonally sloping side edge 24 of each fin 20 is generally straight. Alternately, the diagonally sloping side edge 24 of each fin 20 may be other shaped to obtain a streamlined profile.

In the first embodiment, the guiding member is a guiding plate 40 being horizontally attached to the surface formed by the bottom edges of the cutouts of the diagonally sloping side edges 24 of the fins 20. The guiding plate 40 extends out of the distal end of the air outlet 30 along the gongitudinal directions of the fins 20.

In use, the base 10 is secured to a circuit board (not shown) of an electronic system via two fasteners (not shown) passing through the two installing holes 14 and being secured to the circuit board. The bottom surface of the base 10 abuts onto a chip disposed on the circuit board to absorb the heat generated by the chip. As shown in FIG. 2, airflow 46 as indicated by arrows from a fan (not shown) enters into the heat sink from the air inlet 32 and flows along the channels 22. The heat generated by the chip is transferred to the fins 20 from the base 10, and to the airflow 46. Thus, the airflow 46 becomes increasingly heated. Because the side edges 24 at the air outlet 30 each have a streamlined profile which results in resistance to the heated airflow 46 through the heat sink being relatively reduced, the heated airflow 46 can quickly flows out from the air outlet 30. Then main airflow 462 of the heated airflow 46 is guided by the guiding plate 40 and directly blown toward an outside of the system by a system fan.

Resistance of the fins 20 to the airflow 46 through the heat sink is relatively reduced so that the heated airflow 46 can quickly flow out from the air outlet 30. Thus, an airflow rate passing through the heat sink is relatively increased, and heat dissipation efficiency of the heat sink is enhanced. Furthermore, main airflow 462 of the heated airflow 46 is guided by the guiding plate 40 to be directly blown toward the outside of the system by the system fan, thereby improving heat dissipation effect of the system.

Figure 3:
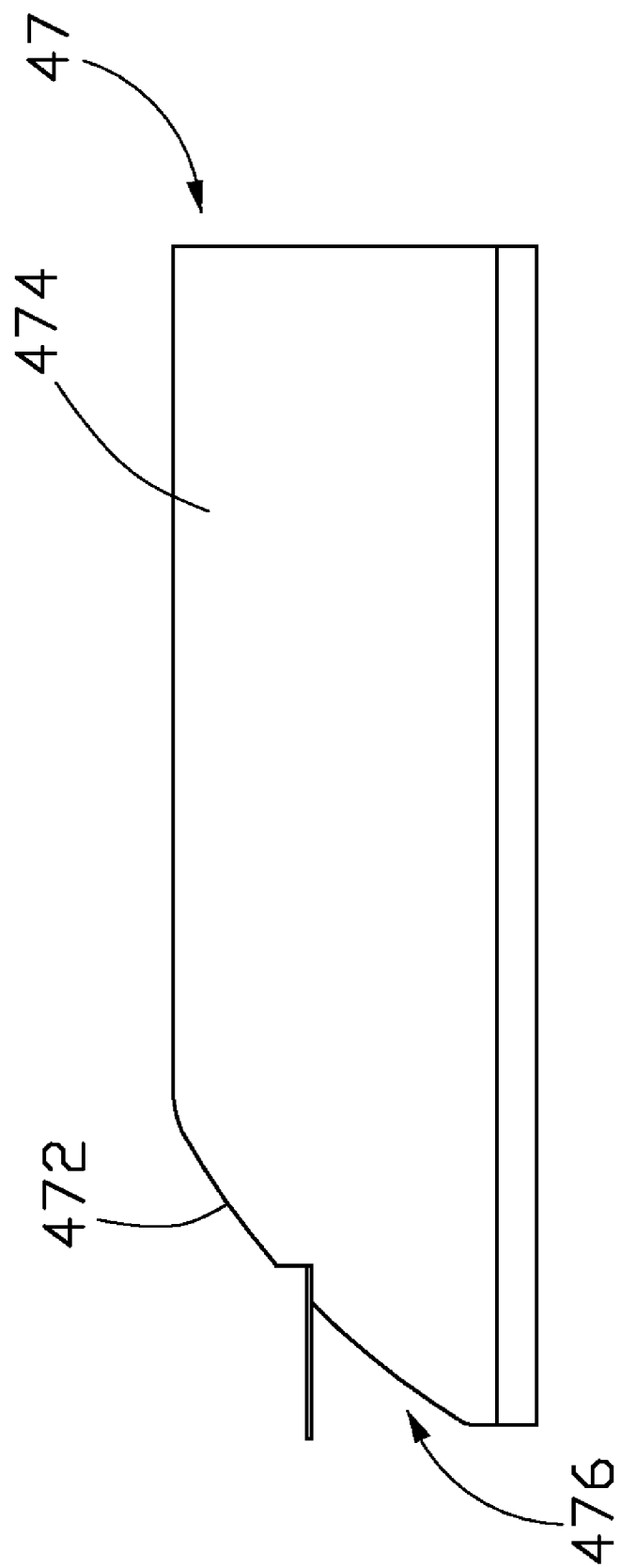
FIG. 3 is a side-elevation view of a heat sink in accordance with a second embodiment of the present invention.

Referring to FIG. 3, in a second embodiment of the present invention, a convex sloping side edge 472 is formed on each fin 474 adjacent an air outlet 476 of a heat sink 47.

Figure 4:
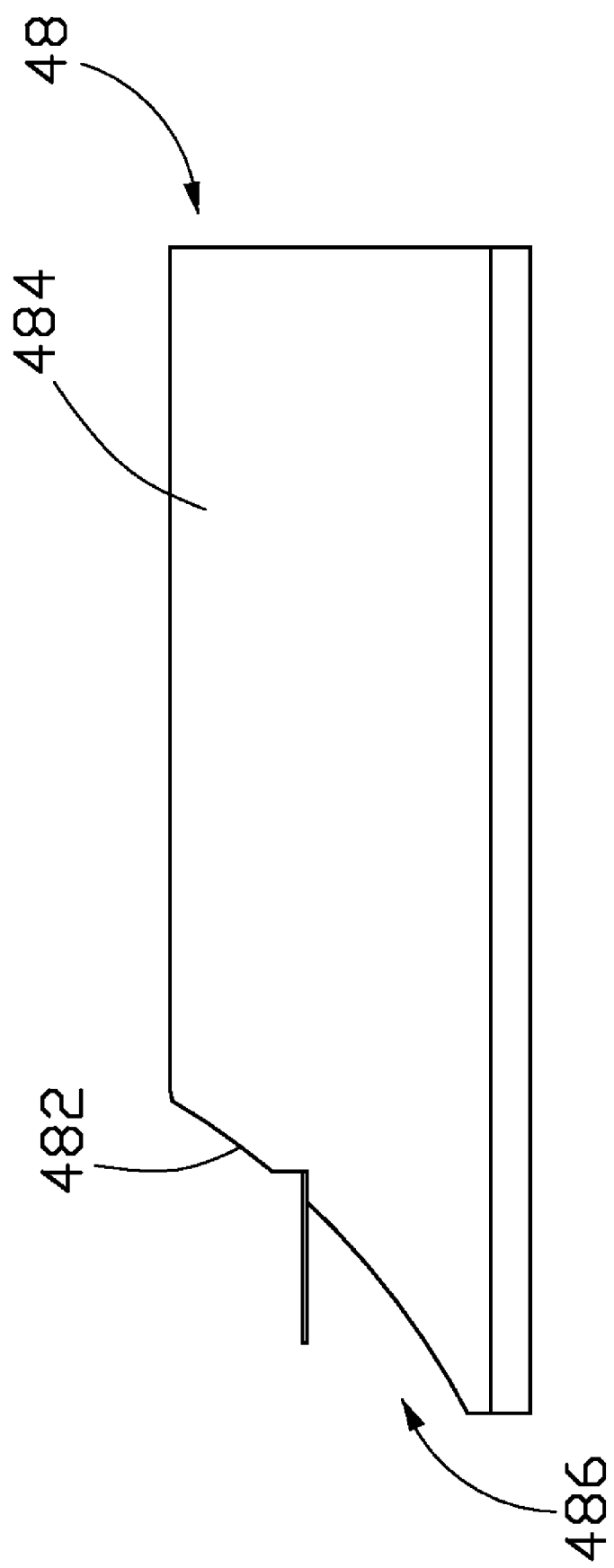
FIG. 4 is a side-elevation view of a heat sink in accordance with a third embodiment of the present invention.
Figure 5:
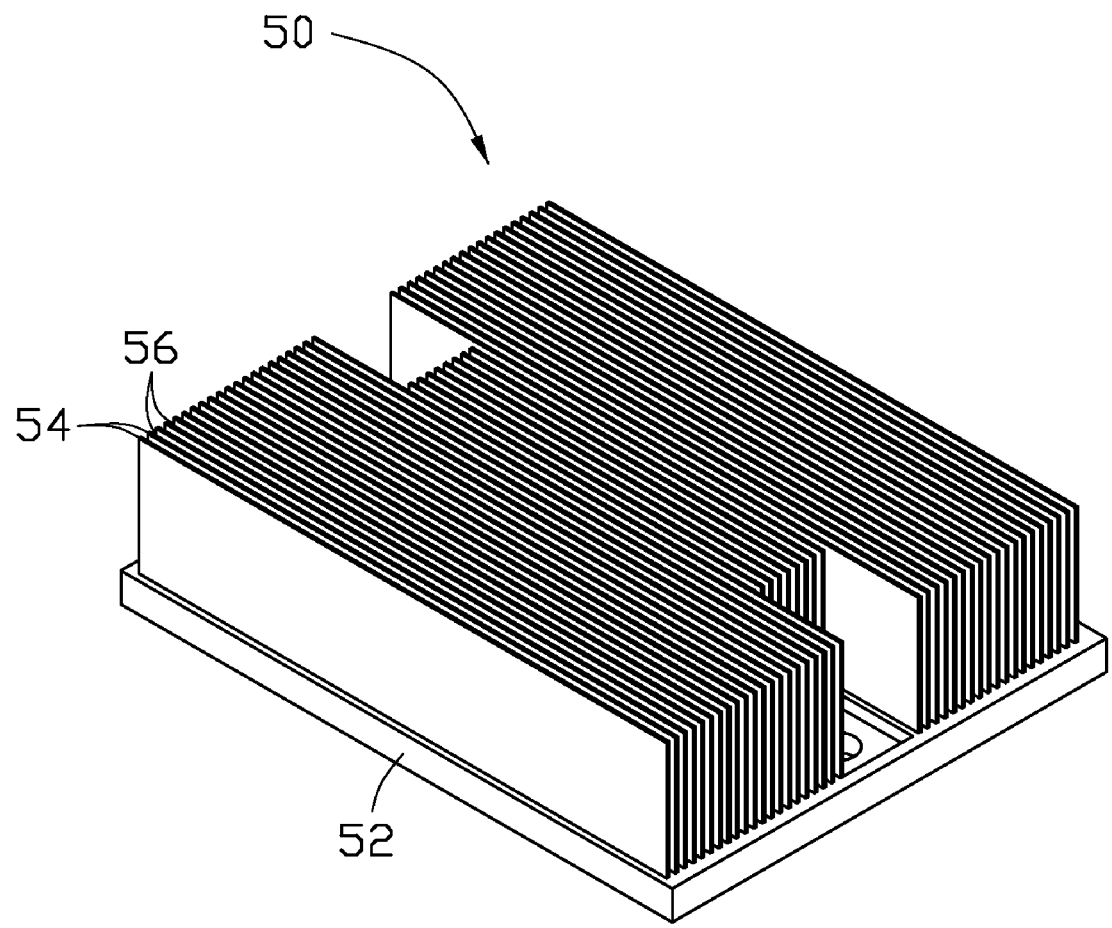
FIG. 5 is an isometric view of a conventional heat sink.
Figure 6:
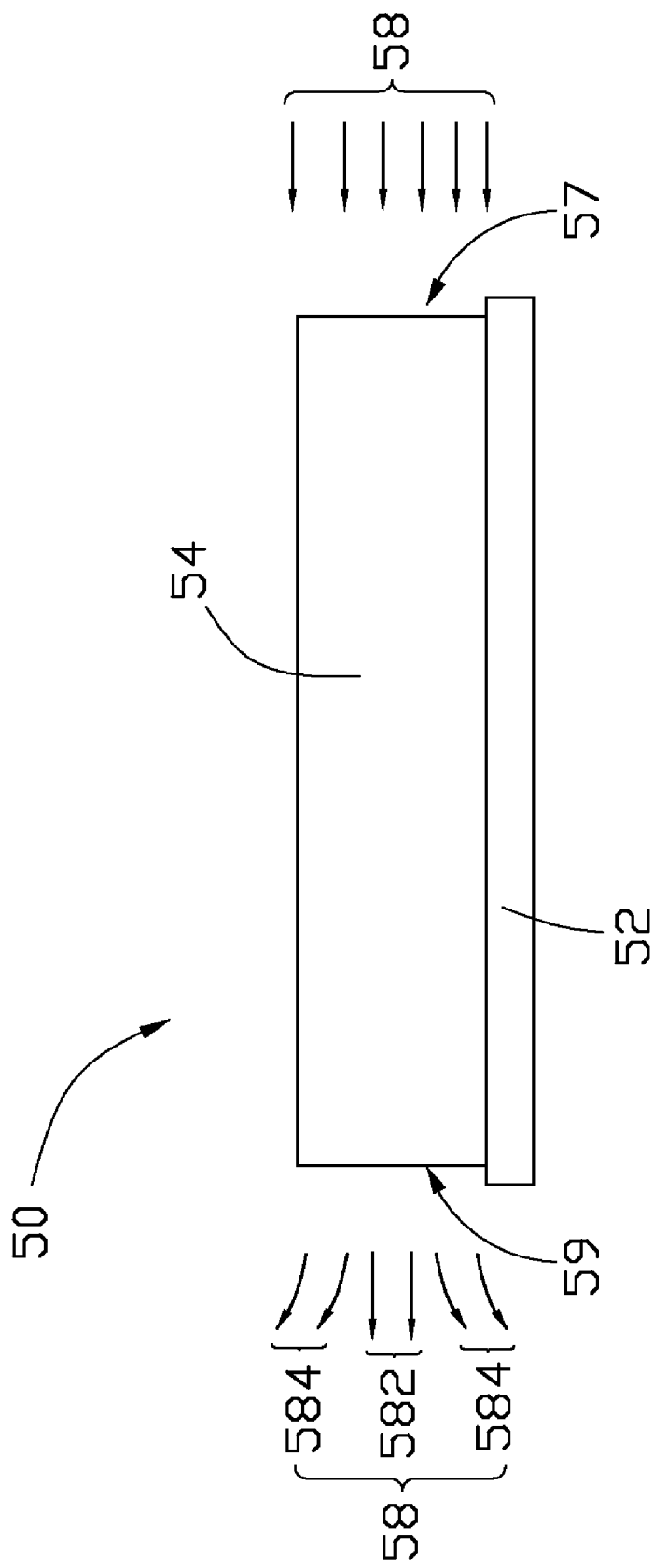
FIG. 6 is a side-elevation view of FIG. 5.

Referring to FIG. 4, in a third embodiment of the present invention, a concave sloping side edge 482 is formed on each fin 484 adjacent an air outlet 486 of a heat sink 48.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising:
    a thermally conductive base having a top surface and a bottom surface configured for being attached onto a heat-generating electronic component;
    a plurality of parallel thermally conductive fins extending from the top surface of the base with channels being formed there between, each of the fins being generally rectangular with the top edge being shorter than the bottom edge, each of the fins comprising an upright side edge perpendicular to the top surface of the base, and an opposite streamlined side edge, the upright side edges of the fins cooperating with the channels to form an air inlet for airflow flowing into the channels, the streamlined side edges of the fins cooperating with the channels to (ann an air outlet for airflow flawing out of the channels; and
    a guiding member being attached at the streamlined side edges of the fins and extending sway from the streamlined side edges configured for guiding airflow flowing out of the channels, the guiding member being in parallel to the top surface of the base;
    wherein the fins substantially decrease from adjacent the air outlet to the distal end of the air outlet along longitudinal directions of the fins, thereby forming the streamlined side edges;
    a cutout is defined at the streamlined side edge of each of the fins, bottom edges of the cutouts cooperatively form a cutout surface parallel to the ton surface of the base, and the guiding member is supportedly attached on the cutout surface.

2. The heat sink as described in claim 1, wherein the streamlined side edge of each fin extends up from adjacent the top surface of the base and slopes toward the air inlet.

3. The heat sink as described in claim 2, wherein the sloping side edge of each fin is straight.

4. The heat sink as described in claim 2, wherein the sloping side edge of each fin is convex.

5. The heat sink as described in claim 2, wherein the sloping side edge of each fin is concave.

6. The heat sink as described in claim 1, wherein the guiding member comprises a guiding plate horizontally attached to upper portions of the streamlined side edges of the fins.

7. The heat sink as described in claim 1, wherein two installing holes are defined in the base.

8. A heat sink comprising:
    a thermally conductive base having a top surface and a bottom surface configured fbr contacting with a heat-generating electronic component;
    a plurality of parallel thermally conductive fins extending from the top surface of the base with channels formed there between, the channels comprising an air inlet for airflow flowing into the channels and an air outlet for airflow flowing out of the channels, each of the fins comprising a streamlined side edge at the air outlet; and
    a guiding plate parallel to the top surface of the base being attached at the streamlined side edges of the fins configured for guiding airflow flowing out of the channels, the guiding plate extending out of the distal end of the air outlet from middle portions of the streamlined side edges.

9. The heat sink as described in claim 8, wherein the streamlined side edge of each fin extends up from adjacent the top surface of the base and slants toward the air inlet.

10. The heat sink as described in claim 8, wherein a cutout is defined at the streamlined side edge of each of the fins, bottom edges of the cutouts cooperatively form a cutout surface parallel to the top surface of the base, and the guiding plate is supportedly attached on the cutout surface.

\* \* \* \* \*